Figure 1G:
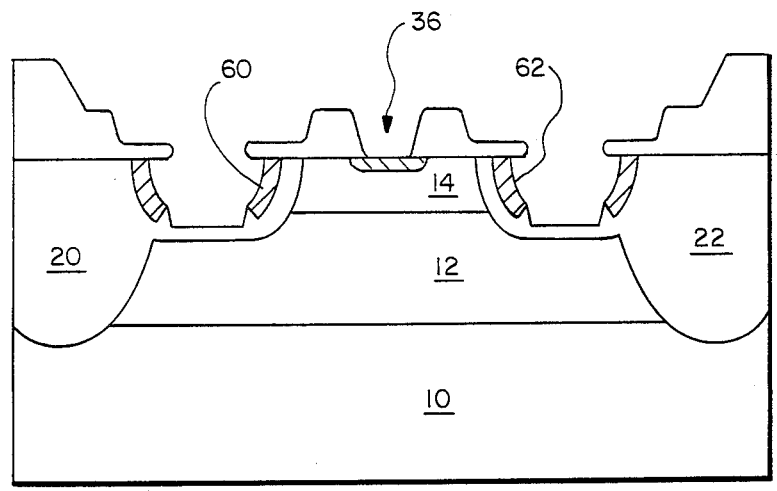

United States Patent [19]

Rice

[11] Patent Number: 4,738,936

[45] Date of Patent: Apr. 19, 1988

[54] METHOD OF FABRICATION LATERAL FET STRUCTURE HAVING A SUBSTRATE TO SOURCE CONTACT

[75] Inventor: Edward J. Rice, Los Gatos, Calif.

[73] Assignee: Acrian, Inc., San Jose, Calif.

[21] Appl. No.: 872,307

[22] Filed: Jun. 9, 1986

Related U.S. Application Data

[63] Continuation of Ser. No. 510,277, Jul. 1, 1983, abandoned.

[51] Int. Cl.⁴ ............................................. H01L 21/302
[52] U.S. Cl. ..................................... 437/141; 437/40; 437/203; 437/913; 437/225; 357/23.3; 357/23.4; 357/55
[58] Field of Search .................. 29/571, 580; 357/23.3, 357/23.4, 56, 47, 55; 148/1.5; 156/657; 437/141, 225, 48, 203, 913

[56] References Cited

U.S. PATENT DOCUMENTS

| | | | |
|---|---|---|---|
| 3,851,379 | 12/1974 | Gutknecht et al. | 357/23.4 |
| 3,916,509 | 11/1975 | Hoeberecht et al. | 357/56 |
| 4,067,100 | 1/1978 | Kojima et al. | 29/580 |
| 4,070,690 | 1/1978 | Wickstrom | 357/23.4 |
| 4,077,111 | 3/1978 | Driver et al. | 29/571 |
| 4,179,794 | 12/1979 | Kosugi et al. | 29/580 |
| 4,181,542 | 1/1980 | Yoshida et al. | 29/571 |
| 4,188,707 | 2/1980 | Asano et al. | 29/571 |
| 4,199,860 | 4/1980 | Beelitz et al. | 29/580 |
| 4,381,201 | 4/1983 | Sakurai | 29/571 |
| 4,561,168 | 12/1985 | Pitzer et al. | 357/23.4 |

*Primary Examiner*—Brian E. Hearn
*Assistant Examiner*—Kevin MacAndrews
*Attorney, Agent, or Firm*—Flehr, Hohbach, Test, Albritton & Herbert

[57] ABSTRACT

An MOS transistor is fabricated which is especially suitable for use in the VHF and UHF regions, comprising a common source lateral MOSFET formed on a substrate, the substrate serving as the connection for the source to the header. The substrate, which is preferably P-type, has P-type and N-type epitaxial regions lying thereon and a sinker which forms a connection from source to substrate. The vertically isolated field effect transistor has a drain on top of a mesa on the N-type epitaxial region of the substrate, a gate in the contact region overhanging the edge of a channel formed adjacent to the mesa, and a source in the lateral edges of the groove defining the edge of the mesa.

The process provides for simultaneous diffusion of the source and drain regions, followed by a metal masking step for connection of the diffused source which lies in the lateral edge of the groove to the sinker, effectively connecting the source to the substrate.

5 Claims, 3 Drawing Sheets

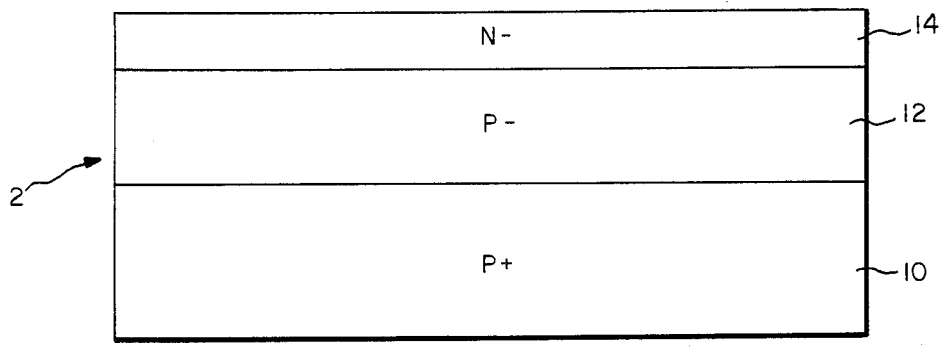
FIG.—IA
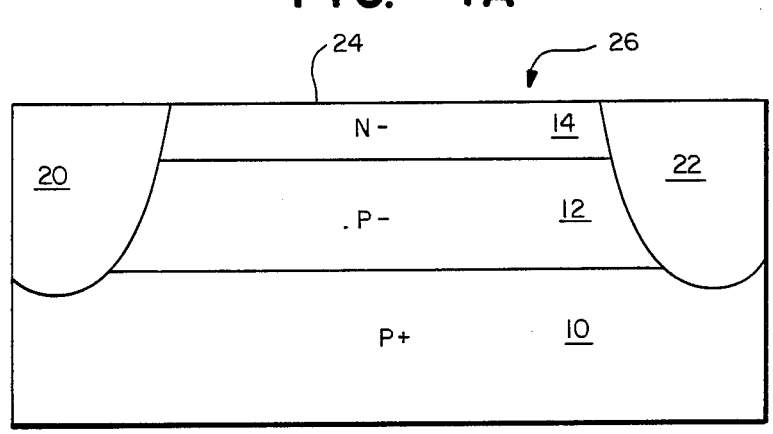
FIG.—IB
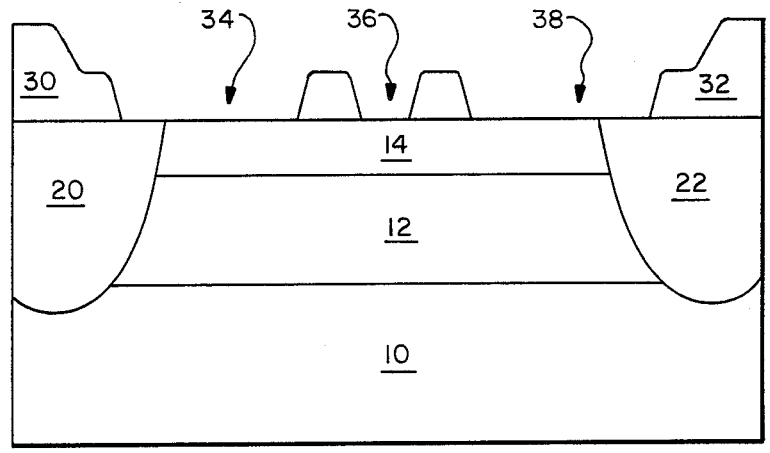
FIG.—IC

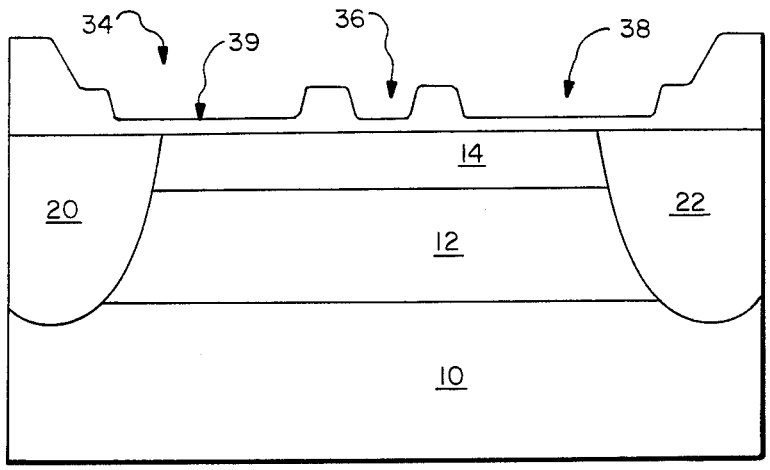
FIG.—1D
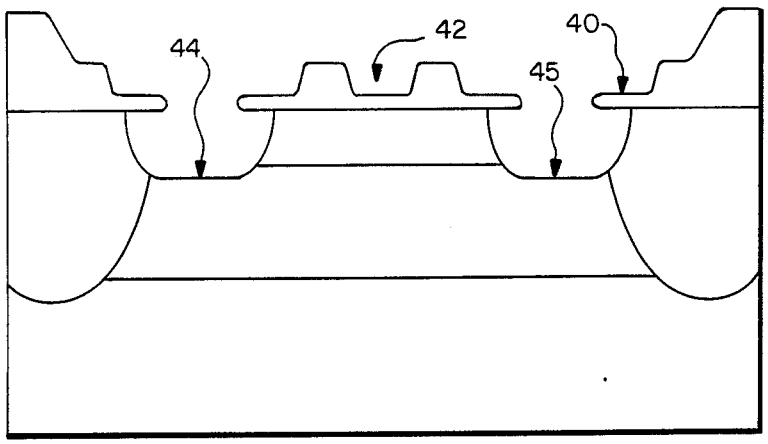
FIG.—1E
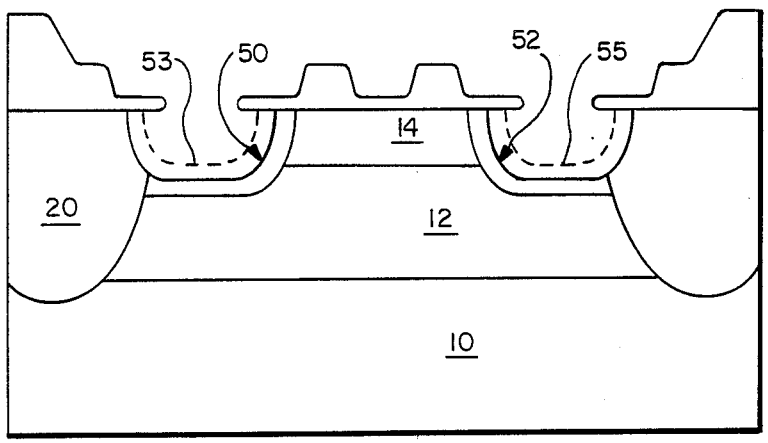
FIG.—1F

METHOD OF FABRICATION LATERAL FET STRUCTURE HAVING A SUBSTRATE TO SOURCE CONTACT

This is a continuation of application Ser. No. 510,277, filed July 1, 1983, now abandoned.

This invention relates generally to semiconductor devices and processes. More particularly, the invention relates to metal oxide semiconductor field effect transistor ("MOSFET") structures and methods of fabricating same, especially for use in the high frequency regions.

It has been known for some time that MOSFET structures are particularly advantageous in high frequency applications because of the short channel lengths available and avoidance of thermal runaway, as well as reduced capacitance problems. However, at the present time, the majority of power transistors operating at microwave frequencies are bipolar devices. These also have their limitations, in particular, a susceptibility to thermal runaway. In other words, the hotter the bipolar device becomes, the more it conducts, heating it further; this is an accumulating phenomenon which raises uncertainties regarding the bounds of its safe operating area. A MOSFET, on the other hand, has a negative temperature coefficient. Consequently, the hotter a MOSFET becomes, the less it conducts, and thermal runaway is avoided. A number of efforts have already been made to develop a reliable, high frequency MOSFET. One of the early efforts to develop an MOS transistor suitable for use in the VHF region is what is now known as a V-groove device, which typically includes an N-type silicon substrate which serves as the drain, an N-type epilayer, a P-type body region which contains the channel region, and an N-type source region. The V-groove is cut deeply enough to expose the surface of both the source region and P-type body region, and the oxide layer is formed on the surface of the groove. In some embodiments, an oxide overhang over the edges of the groove was provided. However, it has been found that this V-groove results in low electron mobility, large cell size, and unduly large parasitic output capacitance.

In a more recent development, discussed in an article in *Electronics Magazine*, Nov. 17, 1982, at pp. 47-48, and incorporated herein by reference, a MOSFET is incorporated in a mesa structure where oxide overhangs on the mesa function as masks in the processing steps. A vertical MOSFET so formed in the mesa structure (called an "isofet") has a short control channel region which is advantageous for high frequency applications.

It is an object of this invention to further enhance the usefulness of such isofet devices by reducing the source impedance, especially the inductance associated with source wires.

It is another object of the invention to reduce expensive packaging techniques by providing a direct source to substrate contact to allow for direct mounting on a metal heat sink.

It is another object of the invention to further reduce output capacitance, and to reduce or eliminate junction capacitance which would inherently be associated with the drain region and source region in a shadow isolated isofet device.

In summary, in accordance with the teachings of this invention, an MOS transistor is fabricated which is especially suitable for use in the VHF and UHF regions and, in a preferred embodiment, comprises a common source lateral MOSFET formed on a substrate, the substrate serving as the connection for the source to the header. The substrate, which is preferably P-type, has P-type and N-type epitaxial regions lying thereon and a sinker which forms a connection from source to substrate. The vertically isolated field effect transistor has a drain on top of a mesa on the N-type epitaxial region of the substrate, a gate adjacent to the drain on the mesa region of the mesa overhanging the edge of a channel formed adjacent to the mesa, and a source in the lateral edges of the groove defining the edge of the mesa.

It should be noted that a further advantage of the process for forming this transistor lies in the fact that the process provides for simultaneous diffusion of the source and drain regions, followed by a metal masking step for connection of the diffused source which lies in the lateral edge of the groove to the sinker, effectively connecting the source to the substrate.

The invention shall now be described with reference to the drawings, in which

FIGS. 1A-1F are section views of a portion of a semiconductor body illustrating the steps in fabricating a MOSFET structure in accordance with one embodiment of the invention.

In the process description herein, the steps described are those appropriate for forming an N-channel enhancement mode device. However, it will be appreciated that the process steps can be adapted by one skilled in the art to make other field effect transistor structures, including a P-channel depletion mode structure.

The process is begun by providing (FIG. 1A) a wafer 2 having a P-plus substrate 10, having a first P-minus epitaxial layer 12 over it, and a N-minus epitaxial layer 14 as the top layer. It has been determined experimentally that a useful width for the P-minus layer 12 is 4 to 8 microns and a resistivity of 10 to 50 ohm-centimeters. A useful starting point for the N-minus region 14 is a thickness of 2 to 4 microns, with a resistivity of approximately 0.5 to 2.0 ohm-centimeters. These values are not required, however, and experimentation may be used by those skilled in the art to establish different values for different structures.

By appropriate masking techniques, such as already very well known in the art, heavily P-plus doped regions 20 and 22 (FIG. 1B) are diffused into a major surface of the body 24. The regions 20 and 22 are diffused to a sufficient depth to reach entirely through the N-minus layer 14 and the P-minus layer 12 to reach into the P-plus substrate 10. These heavily doped regions, which apparently form electrical contact from the upper surface to the substrate, also serve to define wells 26 where the active device comprising the high frequency MOSFET will now be fabricated.

It should be noted that it is also possible to cut a groove or etch a hole down to the substrate layer 10 from the major surface 24, with a P-plus diffusion (relatively thin), then being made into the side walls of the groove. As a further alternative, it would be possible to cut a groove or etch a hole to the substrate layer oxidize the side walls, of this groove or hole, leaving a small hole at the bottom, and metalizing into the hole, and then forming a metal contact to the source of the transistor which is to be formed in the region 26. The essential feature common to all these alternatives is a direct connection between the source of the MOSFET to be fabricated and the substrate 10. However, it should also be noted that all of the advantages summarized above and to be described further below may not be obtained with these alternatives. Therefore, the designer must decide which tradeoffs he is willing to make.

As the next step, a thick oxide layer 30, 32 (FIG. 1C) must be grown over the entire surface of the substrate. The oxide is then removed from the three areas 34, 36, 38, as shown, by appropriate masking steps to define the areas which will become the drain at 36 and the gates 34, 38 of two adjacent devices. The oxide layer is an oxide of silicon, such as $SiO_2$ the masking steps which are carried out using suitable, well known photolithographic techniques, are patterned by etching to expose those portions of the epitaxial N-minus layer 14. A new thin layer of oxide 39 is grown over the whole surface 24. The source contact region is then patterned and the oxide etched away. Thereafter, the exposed surface of the silicon body is etched by an isotropic etch, such as a mixture of hydrofluoric and nitric acid. The isotropic etch undercuts the insulating layer 39 and forms a mesa structure indicated generally at 42 thereunder. A more detailed disclosure of this step in the process may be found in U.S. Pat. No. 4,419,811 entitled, "Method of Fabricating Mesa MOSFET Using Overhang Mass and Resulting Structure," the application being assigned to the assignee of this invention and incorporated herein by reference. It is important to note that the silicon etch described in this step penetrates almost entirely through the N-region 14 and preferably into the P-minus region 12 (FIG. 1E). The reasons for the depth in this etch will be discussed in further detail below. The etched wells 44 and 45, having been formed, thereby defining mesa 42, a P-type diffusion step can be carried out, forming regions 50 and 52 (FIG. 1F). Because of the nature of the diffusion, and the lack of any masking in the wells 44 and 45, the diffused area extends from underneath the overhang through the well to the sinkers 20, 22, defined in the preceding steps.

As an incidental result of the diffusion step, which as is well-known is carried out at high temperature and for sufficient time to cause a reasonable depth of diffusion into the bottom and side walls of the wells 44 and 45, an oxide film 53, 55 is formed, comprising silicon dioxide which covers the surface of the wells 44, 45 up to the overhangs. A metal evaporation step is now carried out, a conductive metal such as aluminum being deposited over the surface of the oxide layer 39. The oxide layer 39 especially functions as a shadow mask and intercepts the metal layer from being deposited on the side walls of the wells 44, 45. Therefore, there is still the exposed oxide on the side walls of the mesa, with the oxide 53, 55 on the bottom of the wells being shielded by the metal mask. This exposed silicon oxide on the side walls of the mesa is then etched to be eliminated. The etch is a preferential etch in the sense that it does not attack the aluminum, so that there is no removal of the metal which rests over the entire oxide coated surface of the mesa or the oxide coated base of the wells 44, 45. The remaining oxide not removed now serves as a mask against an isotropic etch step into the side walls of the mesa is also timed to reduce the thickness of the P-minus layers 50, 52 and to increase the width of the oxide overhang 40 FIG. 1E to controllably define what will function as the gate region to the finished device. Once this step has been successfully timed and completed, the metal is removed from the base of the wells, with the metal over the surface of the mesa also, of course, being removed. A simple masking step with gross alignment is now utilized to remove the oxide from the drain region 36. This now allows for the diffusion of phosphorus into the side walls of the wells 44, 45, to form source regions 60, 62 as well as simultaneous diffusion of the drain region 36. It is an advantage of the sequence of process steps that the oxide covering the surface of the mesa, as well as the bottom of the wells remains in place, functioning as a mask to allow for simultaneous diffusion of source and drain. It should be noted that these intermediate steps between FIGS. 1F and 1G are already known in the art and, if not already apparent from this explanation, can be studied in detail by reference to the above incorporated application of Mr. Rice.

The oxide layer on the base of the wells is now removed, exposing P-minus and P-plus regions as well as N-plus source and drain regions. A metal contact 70, 72 is now deposited in the base of the wells, and up the side wall of this shallow depression to contact this source region and create a metal contact from the foot of the source region 60 to the P-plus sinker 20 which was previously established. By an appropriate masking step, the gate contact 74 and the drain contact 76 are simultaneously defined. These contacts 74, 76 can also be placed by a double layer metal system, the key issue being maintenance of the separation of gate 74 and drain 76 contacts. The separation between gate and source contacts 74, 70 is inherent from the oxide overhang of the mesa during the metal depositing step.

Of course, the prime objective is to connect source to substrate. As is apparent from FIG. 1G and is known in the art of semiconductor device processing, adjacent devices are diffused in the form of interdigitated fingers. Thus the sinker could in fact be diffused at the end or ends of the source finger, and still be "adjacent" the source to provide the necessary substrate connection. In fact, by placement of the P-plus sinker at one or both ends of the source groove, the current is carried along the source metal to the end (or ends) of the sinker to the substrate. Thus two source regions per groove may be provided, a significant space saving.

It will be appreciated that this modified design has achieved several significant improvements over the prior art. First, the source is now directly connected to the substrate; this eliminates source wire inductance, and allows direct mounting of the chip on ground, eliminating the need for an expensive beryllium oxide package, reducing thermal resistance. Secondly and very significantly in the intended uses of this device, the output capacitance is lowered. This comes about because of the reduction of junction capacitance in that area of the P-minus diffusion that is now diffused into the P-minus epi. That is, there simply is no junction as there was in the prior art. Further, there is a significant reduction of junction capacitance in the active drain region because the junction is now between and is N-minus/P-minus, allowing significant depletion into the P-minus region. The importance of reduced output capacitance, as is well know in the art, is that the power gain bandwidth, which is inversely proportional to the output capacitance, will be greater for transistor constructed in accordance with this invention, as compared to the power gain bandwidth of prior art devices.

Figure 1H:
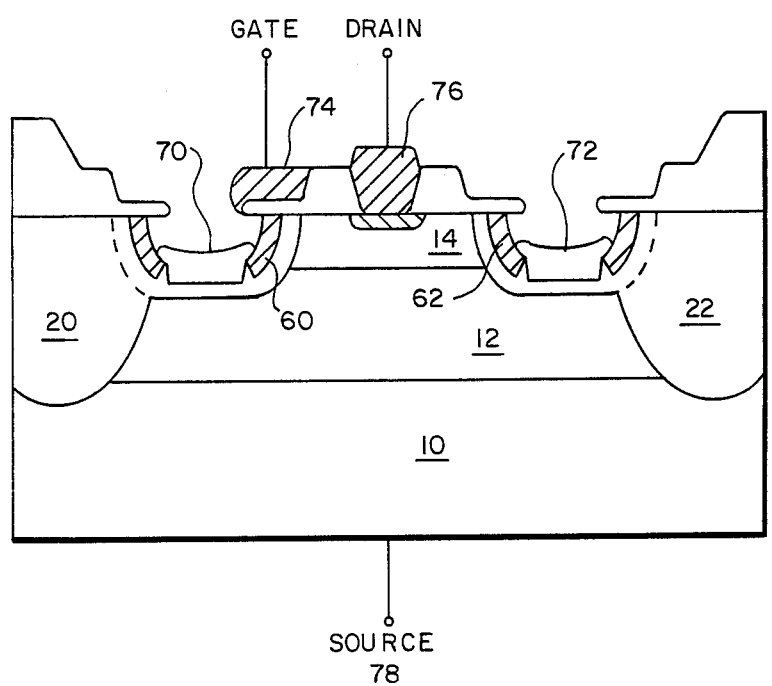

Finally, it appears that it would be within the ordinary skill of the art to design a lateral diffused P-plus resistor in series with the metal source finger, which would significantly improve input impedance matching and bandwidth. Another possible modification of the device shown in FIG. 1H is to diffuse P-plus over the entire inactive region (which is not shown in the figure, as it is the region between active devices as shown in FIG 1H). With this modification, the finished device will have a region of low conductivity connected to the source 78 or common lead ground plane completely surrounding the active device. This allows for the construction for matching elements for transmission lines on the inactive surface, monolithically. Further, removing oxide from the inactive region and covering it with metal will lower vertical source resistance by increasing the area of the resistor. It will also allow for bonding in source wires to determine the effects of the vertical resistor.

While specific embodiments of this invention have been presented in the specification, these specific embodiments are intended to serve as examples that are not be construed as limitations on the scope of the invention. Numerous other embodiments of this invention will become readily apparent to those with ordinary skill in the art in the light of the teaching of the specification, whose scope is to be determined only by the language of the appended claims.

What is claimed is:

1. A method of forming an MOS transistor in a substrate comprising at least a highly doped layer of a first conductivity type, a lightly doped epitaxial layer thereon of the same first conductivity type and an epitaxial layer thereon of opposite conductivity type, comprising the steps of
    (a) forming a sinker of first conductivity type defining the region in which said transistor is to be formed, said sinker extending down to said highly doped layer;
    (b) forming a mesa whose side walls include a narrow region of first conductivity type extending from said mesa to said sinker;
    (c) diffusing a source region into the side walls of said mesa and a drain region into the top of said mesa;
    (d) forming a conductive layer extending from said source region to said sinker region whereby said MOS transistor source is in contact with said highly conductive bottom layer of said substrate, and
    (e) forming a gate contact at an end of said mesa separated from a drain contact on said mesa, and a source contact to the source region in the side wall of said mesa to complete said MOS transistor.

2. A method as claimed in claim 1 wherein said step of forming a mesa comprises forming an oxide layer on a major surface of said substrate where said mesa is to be defined, exposing a selected portion of said substrate, and etching said selected portion vertically into said substrate and laterally under said oxide layer, said vertical etch extending substantially entirely down through said epitaxial region of second conductive conductivity type to define the side wall of said mesa.

3. A method as claimed in claim 2 wherein said diffusing step comprises removing a portion of the oxide on top of said mesa and simultaneously diffusing the source and drain regions of said transistor.

4. A method as claimed in claim 3 further comprising a second etching silicon of said side walls of said mesa to controllably thin said narrow region of first conductivity type to define the channel characteristics of said transistor.

5. A method as in claim 4 wherein said gate and drain contacts are simultaneously defined.

* * * * *